(12) United States Patent
Son et al.

(10) Patent No.: US 7,226,867 B2
(45) Date of Patent: Jun. 5, 2007

(54) METHOD OF ETCHING A METAL LAYER USING A MASK, A METALLIZATION METHOD FOR A SEMICONDUCTOR DEVICE, A METHOD OF ETCHING A METAL LAYER, AND AN ETCHING GAS

(75) Inventors: Seung-Young Son, Seoul (KR); Cheol-Kyu Lee, Yongin (KR); Chang-Jin Kang, Suwon (KR); Byeong-Yun Nam, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

(21) Appl. No.: 10/419,075

(22) Filed: Apr. 21, 2003

(65) Prior Publication Data

US 2004/0038547 A1    Feb. 26, 2004

(30) Foreign Application Priority Data

Aug. 20, 2002   (KR) .................... 10-2002-0049296

(51) Int. Cl.
H01L 21/302 (2006.01)

(52) U.S. Cl. ...................... 438/706; 438/719

(58) Field of Classification Search ............. 216/63, 216/67, 72, 75, 77, 79; 438/706, 710, 714, 438/719, 720, 723, 734, 736, 738, 742, 743, 438/780

See application file for complete search history.

(56) References Cited

U.S. PATENT DOCUMENTS 5,160,407 A * 11/1992 Latchford et al. ......... 438/714
5,578,166 A * 11/1996 Hirota ........................ 216/67
5,981,398 A * 11/1999 Tsai et al. .................. 438/710

(Continued)

FOREIGN PATENT DOCUMENTS

EP         0 622 477 B1    11/1994

(Continued)

OTHER PUBLICATIONS

Rossnagel et al., Handbook of Plasma Processing, 1990, Noyes Publications, p. 209.*

(Continued)

*Primary Examiner*—Kin-Chan Chen
(74) *Attorney, Agent, or Firm*—Harness, Dickey & Pierce, P.L.C.

(57) ABSTRACT

Methods for etching a metal layer and a metallization method of a semiconductor device using an etching gas that includes $Cl_2$ and $N_2$ are provided. A mask layer is formed on the metal layer, the etching gas is supplied to the metal layer, and the metal layer is etched by the etching gas using the mask layer as an etch mask. The metal layer may be formed of aluminum or an aluminum alloy. $Cl_2$ and $N_2$ may be mixed at a ratio of 1:1 to 1:10. The etching gas may also include additional gases such as inactive gases or gases that include the elements H, O, F, He, or C. In addition, $N_2$ may be supplied at a flow rate of from 45–65% of the total flow rate of the etching gas, which results in a reduction in the occurrence of micro-loading and cone-shaped defects in semiconductor devices.

25 Claims, 3 Drawing Sheets

U.S. PATENT DOCUMENTS

| | | | |
|---|---|---|---|
| 6,017,826 A * | 1/2000 | Zhou et al. | 438/720 |
| 6,080,529 A * | 6/2000 | Ye et al. | 430/318 |
| 6,090,717 A * | 7/2000 | Powell et al. | 438/710 |
| 6,242,358 B1 * | 6/2001 | Chu et al. | 438/706 |
| 6,291,361 B1 * | 9/2001 | Hsia et al. | 438/738 |
| 2002/0072228 A1 * | 6/2002 | Kuo | 438/669 |

FOREIGN PATENT DOCUMENTS

| | | |
|---|---|---|
| EP | 1011135 | 6/2000 |
| JP | 6-295886 | 10/1994 |
| JP | 11-214370 | 8/1999 |

OTHER PUBLICATIONS

Wolf, Silicon Processing for the VLSI Era, 2002, Lattice Press, vol. 4, pp. 244-245.*

Wolf et al., Silicon Processing for the VLSI Era, 1986, Lattice Press, vol. 1, p. 441.*

Korean Office Action dated Jul. 7, 2004.

English translation of German Office Action dated Jul. 7, 2006.

* cited by examiner

METHOD OF ETCHING A METAL LAYER USING A MASK, A METALLIZATION METHOD FOR A SEMICONDUCTOR DEVICE, A METHOD OF ETCHING A METAL LAYER, AND AN ETCHING GAS

CROSS-REFERENCE TO RELATED APPLICATIONS

This U.S. non-provisional application claims priority under 35 U.S.C. §119 to Korean Patent Application No. 2002-49296, filed Aug. 20, 2002 in the Korean Intellectual Property Office, the contents of which are incorporated herein by reference in their entirety.

BACKGROUND OF THE INVENTION

1. Field of the Invention

The present invention relates generally to a method of manufacturing a semiconductor device, and more particularly, to a metallization method and a method of etching a metal layer using an etching gas that includes $Cl_2$ and $N_2$, and an etching gas formed of $Cl_2$ and $N_2$.

2. Description of the Related Art

As semiconductor devices become highly integrated, the line width of metal interconnection layers of multilevel metal interconnection structures and the distance between adjacent metal interconnection layers have been reduced while the height of the metal interconnection layers has been increased to increase the aspect ratio. In these semiconductor devices, the metal interconnection layers electrically connect unit devices. The metal interconnection layer may be formed of a material that has a low resistance in order to obtain devices that can operate at a high speed. Aluminum or an aluminum alloy may be used to form the metal interconnection layers.

Although aluminum has excellent electric conductivity, the difference between the etching selectivity of aluminum and the etching selectivity of a photoresist material is small. As a result, the thickness of the photoresist layer is increased. However, when the thickness of the photoresist layer is increased, the throughput of the semiconductor device decreases, and it can become difficult to pattern the photoresist layer. When the thickness of the photoresist layer pattern is reduced to avoid these problems, the regions that are to be protected when patterning the metal interconnection layers cannot be protected. Technology has been developed that uses a hard mask when forming aluminum interconnection layers so that micro-sized metal interconnection patterns for the highly-integrated semiconductor device may be formed.

In an etching process for forming metal interconnection layers that uses a hard mask, a reaction by-product may be formed which may be removed during the etching process or may be deposited on the inner walls of the etching chamber. However, if the reaction by-product is not firmly attached to the inner walls of the etching chamber, the reaction by-product may fall to the surface of a wafer during the etching process, which may cause short circuits between the metal interconnection patterns.

In one conventional method that uses a hard mask to form the metal interconnection layers, the etching gas includes at least one fluorocarbon-based gas such as $CF_4$ or $CHF_3$, as well as $Cl_2$ and $BCl_3$, which have been used in conventional processes where a photoresist layer is used as the etch mask. The fluorocarbon-based gases are used for the passivation of the sidewalls of the metal interconnection patterns. When a fluorocarbon-based gas is used in the etching gas, a by-product deposition layer having low adhesive characteristics may be created in the form of flakes located on the inner walls of the etching chamber. Because the by-product has low adhesive characteristics, the by-product may fall onto the wafer's surface during the etching process. Thus, the number of particles (e.g., contaminants) present on the wafer surface may increase, which reduces yield.

In another conventional method, an etching gas of $Cl_2/BCl_3/N_2$ is formed by using $N_2$ as a passivation gas instead of a fluorocarbon-based gas, which, as described above, may cause the generation of particles in the etching chamber. However, when this etching gas is used, cone-shaped defects occur on the semiconductor wafer due to the presence of $BCl_3$.

In addition, as the aspect ratio of the metal interconnection patterns increases in a highly-integrated semiconductor device, micro-loading may occur. In particular, micro-loading may vary the etching rate according to the pattern density of regions of a chip on the wafer or may vary the profile shape of the patterns due to a difference in the critical dimension (CD) between a top sectional profile and a bottom sectional profile of the patterns. As the line width of the metal interconnection patterns is reduced, defects may occur due to the micro-loading, which may cause failures in the semiconductor device.

SUMMARY OF THE INVENTION

In at least one exemplary embodiment of the present invention, a method of etching a metal layer using an etching gas that includes $Cl_2$ and $N_2$ is provided. In particular, the metal layer is etched with an etching gas containing $Cl_2$ and $N_2$ using a mask pattern, such as a hard mask pattern, as an etch mask. The mask pattern may be formed of an oxide, a nitride, or an oxynitride. In addition, the metal layer may be etched using inductively coupled plasma (ICP) etching equipment. The metal layer may be formed of aluminum or an aluminum alloy.

The etching gas may be formed by mixing $Cl_2$ and $N_2$ at a ratio of from 1:1 to 1:10. The etching gas may include an inactive gas such as Ar, He, Ne, and Xe. In addition, the etching gas may include an additional gas containing H, O, F, He or C, such as HBr, $CF_4$, $CHF_3$, $CH_2F_2$, $SF_5$, $NF_3$, $H_2$, $O_2$, $SiCl_4$, CO, $C_4F_8$, $C_5F_6$, $He$—$O_2$, and $CCl_4$. The additional gas may be supplied at a flow rate of up to 20% of the total flow rate of the etching gas. The $N_2$ in the etching gas may be supplied at a flow rate of 45 to 65% of the total flow rate of the etching gas.

At least one other exemplary embodiment of the present invention provides a metallization method for a semiconductor device. A mask pattern, such as a hard mask pattern, is formed on an interconnection layer which includes a metal layer. The metal layer may be formed of aluminum or an aluminum alloy. An interconnection pattern is formed by etching the interconnection layer using an etching gas that is formed of $Cl_2$ and $N_2$ and using the mask as an etch mask. The interconnection layer may include a barrier layer that contacts the bottom of the metal layer and an anti-reflective layer positioned between the metal layer and the mask pattern. Both the barrier layer and the anti-reflective layer may be formed of Ti, TiN, or a Ti/TiN stacked structure.

The etching gas may be formed by mixing $Cl_2$ and $N_2$ at a ratio of from 1:1 to 1:10. The $N_2$ may be supplied at a flow rate of 45 to 65% of the total flow rate of the etching gas. In addition, the etching gas may include an inactive gas such as Ar, He, Ne, and Xe and/or an additional gas such as HBr, $CF_4$, $CHF_3$, $CH_2F_2$, $SF_5$, $NF_3$, $H_2$, $O_2$, $SiCl_4$, CO, $C_4F_8$, $C_5F_6$, He—$O_2$, and $CCl_4$. Because $BCl_3$ gas is not used in the etching gas, the generation of cone-shaped defects in the interconnection pattern and the generation of an undercut in the interconnection pattern may be reduced. In addition, by controlling the flow rate of $N_2$ in the etching gas, microloading may be reduced and a substantially uniform etching rate may be obtained in the wafer, regardless of the difference in pattern density of different regions of the wafer. Moreover, a by-product layer having a tight column structure and strong adhesive characteristics may be firmly deposited on the inner walls of the etching chamber so that particles do not fall on the wafer.

BRIEF DESCRIPTION OF THE DRAWINGS

Exemplary embodiments of the present invention will be readily understood with reference to the following detailed description thereof provided in conjunction with the attached drawings in which.

DETAILED DESCRIPTION OF EXEMPLARY EMBODIMENTS OF THE INVENTION

Figure 1A:
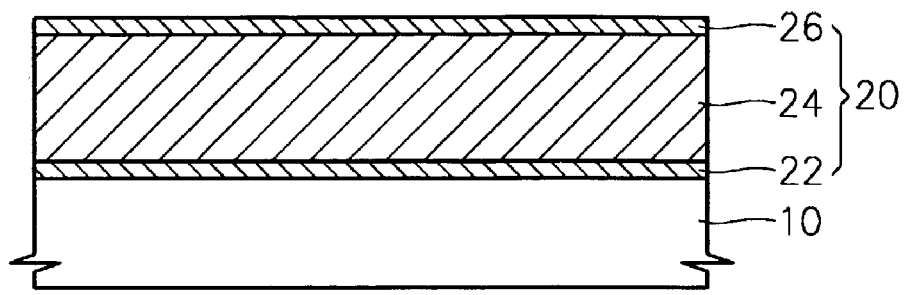
FIGS. 1A through 1D are cross-sectional views illustrating a metallization method for a semiconductor device according to an exemplary embodiment of the present invention.

Exemplary embodiments of the present invention will now be described more fully with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art. In the drawings, the thicknesses of layers and regions are exaggerated for clarity. It will also be understood that when a layer is referred to as being "on" another layer or substrate, it may be located directly on the other layer or substrate, or intervening layers may be present. It is to be further understood that when a layer is referred to as being "between" two other layers, it may be positioned such that the two other layers contact the layer, or intervening layers may be present. In addition, when a layer is referred to as being "under" another layer, it may be located directly under the layer, or intervening layers may be present. Throughout the specification, like numbers refer to like elements.

FIGS. 1A through 1D are cross-sectional views illustrating a metallization method for a semiconductor device according to an exemplary embodiment of the present invention.

Referring to FIG. 1A, a barrier layer 22, a metal layer 24, and an anti-reflective layer 26 are sequentially formed on a semiconductor substrate 10 to form an interconnection layer 20. The barrier layer 22 may be formed of titanium (Ti), titanium nitride (TiN), or a Ti/TiN stacked structure to improve adhesion between the semiconductor substrate 10 and the interconnection layer 20, and to reduce the diffusion of metal from the interconnection layer 20 to the semiconductor substrate 10. The barrier layer 22 may be formed by sequentially depositing a Ti layer to a thickness of about 60 Å and a TiN layer to a thickness of about 250 Å. The metal layer 24, which may be formed of aluminum or an aluminum alloy, may be formed to a thickness of about 3000 to 4000 Å. Although the metal layer is described herein as being formed of aluminum or an aluminum alloy, any metal that has a low resistance may be used to form the metal layer. Suitable examples of low resistance metals would be easily identified by one of skill in the art.

The anti-reflective layer 26 is formed to reduce the diffused reflection of light on an interconnection layer pattern which is formed in a subsequent photolithography process. The anti-reflective layer may be formed of Ti, TiN, or a Ti/TiN stacked structure. For example, the anti-reflective layer 26 may be formed by sequentially depositing a Ti layer to a thickness of about 100 Å and a TiN layer to a thickness of about 800 Å.

Figure 1B:
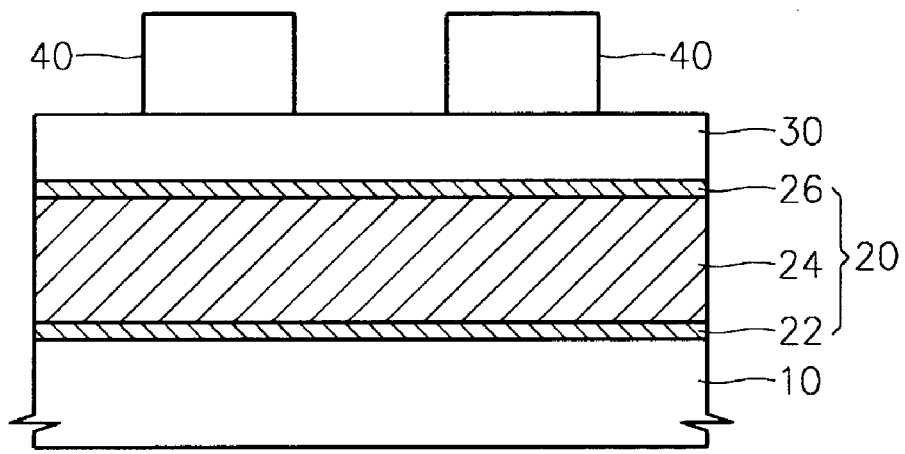

Referring to FIG. 1B, a mask layer 30, such as a hard mask layer, is formed on the interconnection layer 20. The mask layer 30 may be formed of an insulating material that has an etching resistance to the etching gas used in the etching process to pattern the interconnection layer 20. Suitable examples include silicon oxide, silicon nitride, and oxynitride. For example, the mask layer 30 may be formed of $SiO_2$, $Si_3N_4$, SiON, or PE-TEOS.

A photoresist layer pattern 40 that exposes portions of the mask layer 30 is formed on the mask layer 30. The photoresist layer pattern 40 may be formed to a thickness of approximately 4000 Å.

Figure 1C:
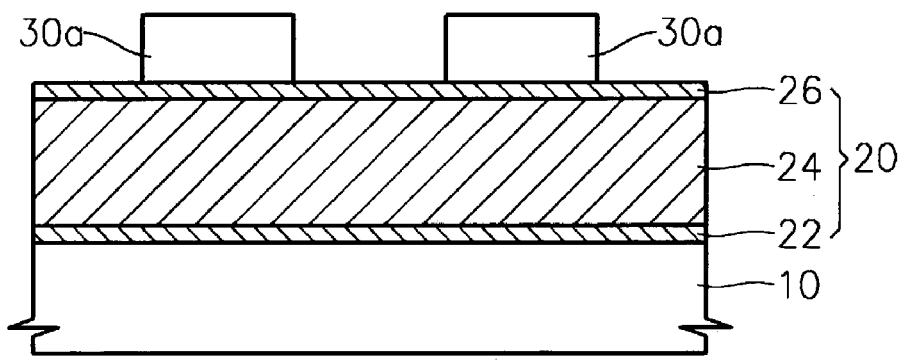

Referring to FIG. 1C, the mask layer 30 is etched using the photoresist layer pattern 40 as an etch mask to form a mask pattern 30a which exposes portions of the interconnection layer 20. Thereafter, the photoresist layer pattern 40 is removed.

Figure 1D:
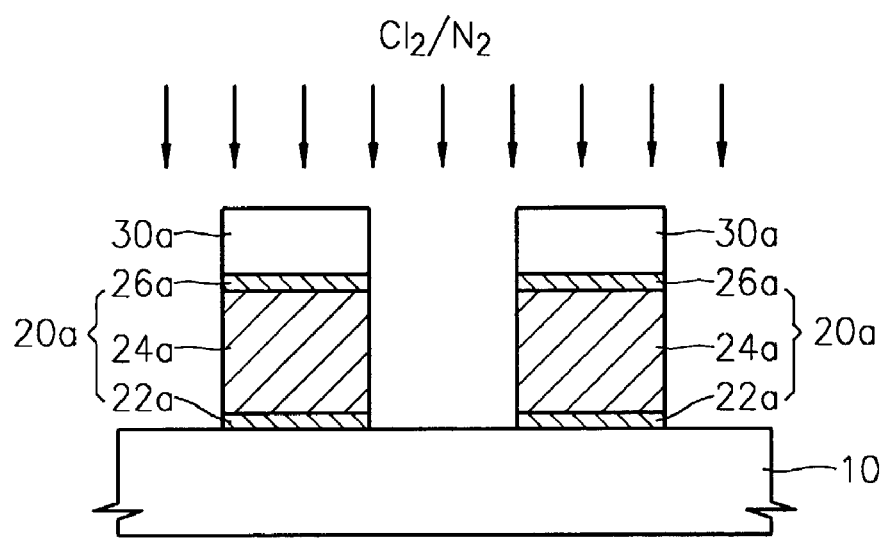

Referring to FIG. 1D, the interconnection layer 20 is etched by the etching gas formed of $Cl_2$ and $N_2$ using the mask pattern 30a as an etch mask to form an interconnection pattern 20a that includes a barrier layer pattern 22a, a metal layer pattern 24a, and an anti-reflective layer pattern 26a. The etching process used to form the interconnection pattern 20a may be a reactive ion etching (RIE) method using inductively coupled plasma (ICP) etching equipment, a plasma assisted etching method, or plasma enhanced chemical vapor deposition. When a dual power source is used, the etching process may be performed on the interconnection layer 20 using a source power Ws of about 500 to 2500 W, a bias power Wb of about 40 to 350 W, and a pressure of about 3 to 30 mT. When a single power source is used, the etching process may be performed on the interconnection layer 20 using a power of about 250 to 2000 W and a pressure of about 30 to 300 mT. The flow rate of $N_2$ in the etching gas may be about 45 to 65% of the total flow rate of the etching gas.

The etching gas may be formed of $Cl_2$ and $N_2$. The etching gas may also include an inactive gas such as Ar, He, Ne, or Xe. By substituting an inactive gas for $BCl_3$, which is used in conventional etching gases, a stable plasma state of the etching gas can be maintained and defects caused by particles generated during the etching process may be reduced.

In addition, the etching gas may further include an additional gas that contains the molecules H, O, F, He, and/or C to improve the etching efficiency. The additional gas may be supplied at a flow rate of from 0 to 20% of the total flow rate of the etching gas. Suitable examples of the additional gas include HBr, $CF_4$, $CHF_3$, $CH_2F_2$, $SF_5$, $NF_3$, $H_2$, $O_2$, $SiCl_4$, CO, $C_4F_8$, $C_5F_6$, He—$O_2$, and $CCl_4$.

Further, the flow rates of the gases present in the etching gas can be controlled to provide $Cl_2$ and $N_2$ at a flow rate ratio of 1:1 to 1:10 in the etching gas. For example, the amount of $N_2$ present in the etching gas can be controlled to be equal to or greater than the amount of $Cl_2$ present in the etching gas to reduce the generation of an undercut in the interconnection pattern 20a when etching the interconnection layer 20.

By etching the interconnection layer 20 according to the above-described exemplary method, the number of cone-shaped defects generated in the interconnection pattern 20a, the generation of an undercut in the interconnection pattern 20a, and micro-loading of the wafer may be reduced. Thus, a substantially uniform etching rate may be obtained in the wafer regardless of the difference in pattern density so that sidewalls that are substantially vertical may be formed with little difference in the critical dimension (CD) between the top sectional profile and the bottom sectional profile of the interconnection pattern 20a.

The above-described etching process for the interconnection layer 20 according to one exemplary embodiment of the present invention was performed several hundreds of times in an etching chamber. It was observed that a by-product layer was deposited on the inner walls of the etching chamber. Scanning electron microscope (SEM) photographs confirmed that a by-product layer was formed in a tight column structure and that the by-product was firmly deposited on the inner walls of the chamber so that the by-product would not fall on the wafer.

In a metallization method for a semiconductor device according to another exemplary embodiment of the present invention, effects of the total flow rate of the etching gas used in the etching process of the interconnection layer 20 containing an aluminum layer were evaluated (data not shown). Here, the etching gas was formed by mixing $Cl_2$, $N_2$, and Ar. Ar was used as the inactive gas. The flow rates of these gases were maintained at a ratio of 8:10:4 respectively. The aluminum layer was then etched by the etching gas while the total flow rate of the etching gas was varied (e.g., 110 sccm, 220 sccm, 275 sccm, and 330 sccm). The number of cone-shaped defects generated on the aluminum layer as a result of the etching process was then compared. It was determined that in this experiment, cone-shaped defects did not occur on the interconnection pattern, regardless of the total flow rate of the etching gas.

Figure 2:
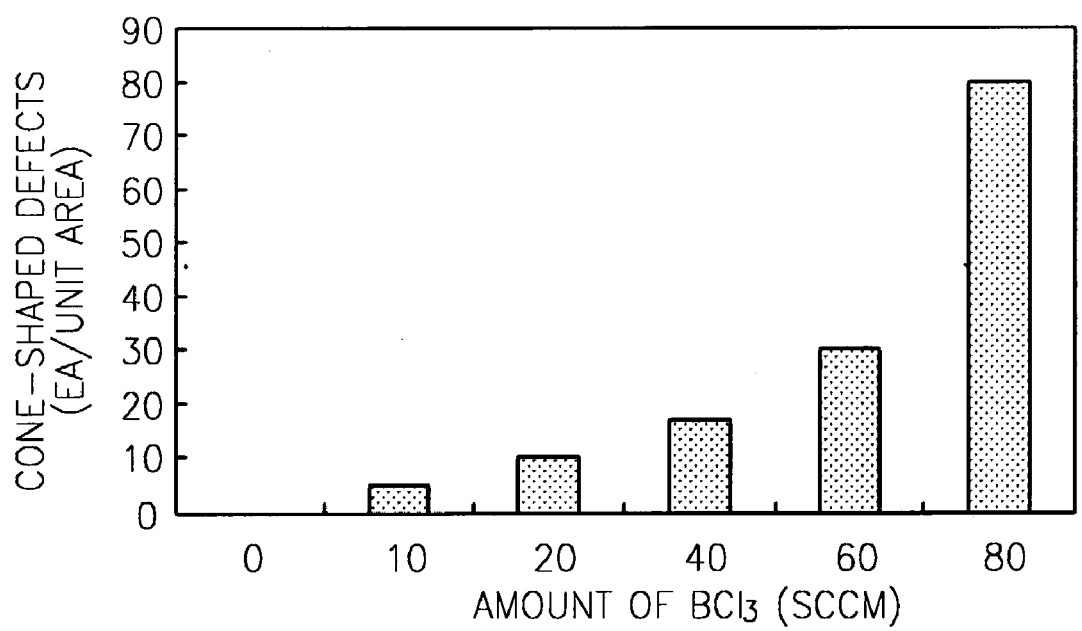
FIG. 2 is a graph illustrating the number of cone-shaped defects per unit area with respect to the amount of $BCl_3$ present in a conventional etching gas.

FIG. 2 is a graph illustrating the number of cone-shaped defects with respect to the amount of $BCl_3$ used in a conventional etching gas.

To compare a metallization method according to an exemplary embodiment of the invention that uses $Cl_2$ and $N_2$ as the etching gas to a conventional method that uses $BCl_3$ in the etching gas, the following experiment was performed. The results of the experiment are shown in FIG. 2. In this experiment, $BCl_3$ was added to an etching gas formed of $Cl_2$, $N_2$, and Ar. The etching gas was supplied to an etching chamber while maintaining the flow rates of $Cl_2$, $N_2$, and Ar at a ratio of 8:10:4 respectively and varying the flow rate of the etching gas (e.g., 110 sccm, 220 sccm, 275 sccm, and 330 sccm). The flow rate of $BCl_3$ added to the etching gas was varied in order to observe the number of cone-shaped defects generated on the aluminum layer pattern, which was obtained by etching the aluminum layer using the etching gas. The $BCl_3$ was supplied at flow rates of 0 sccm, 10 sccm, 20 sccm, 40 sccm, 60 sccm, and 80 sccm.

As shown in FIG. 2, when $BCl_3$ was not added to the etching gas, cone-shaped defects were not generated. However, as the amount of $BCl_3$ supplied to the etching chamber was increased, the number of cone-shaped defects also increased.

Figure 3:
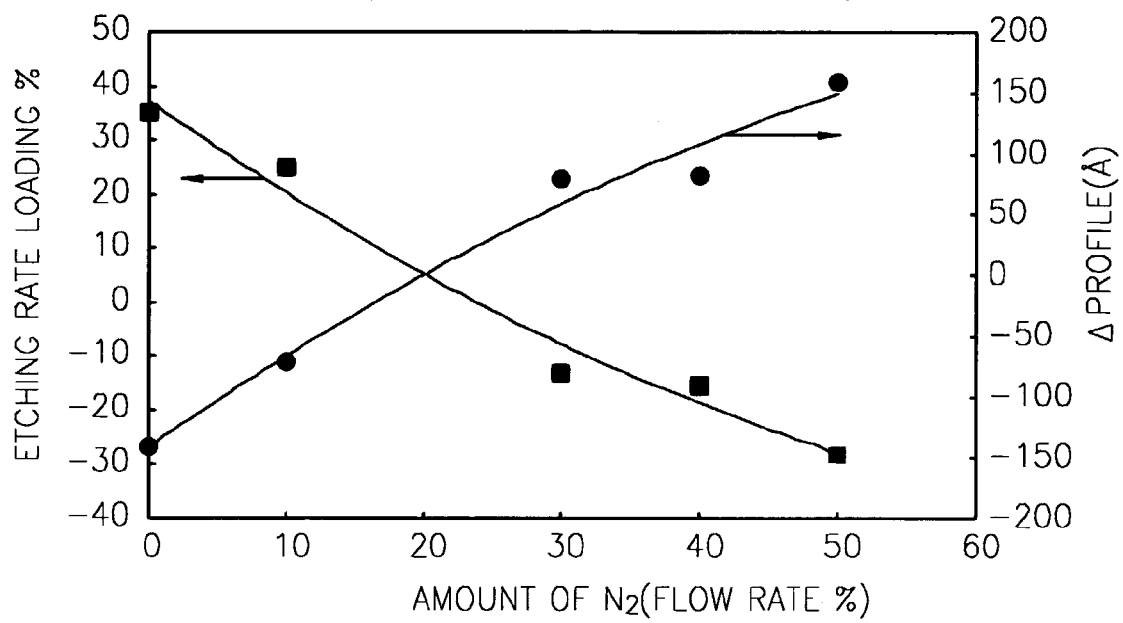
FIG. 3 is a graph illustrating micro-loading with respect to the amount of $N_2$ present in a conventional etching gas.

FIG. 3 is a graph illustrating micro-loading with respect to the amount of $N_2$ present in an aluminum layer etching gas used in a conventional method.

To determine the effects of $N_2$ on micro-loading, the following experiment was conducted using a conventional etching gas that contained $BCl_3$. By varying the amount of $N_2$ in a conventional etching gas known to cause micro-loading, the effects of $N_2$ on micro-loading may be effectively measured. In order to perform this experiment, dual power source ICP etching equipment was used to etch the aluminum layer. A source power Ws of 1600 W, a bias power Wb of 220 W, and a pressure of 18 mT were applied. In addition, a mixture of $Cl_2$ at a flow rate of 150 sccm, $BCl_3$ at a flow rate of 60 sccm, and $N_2$ at various flow rates was used as the etching gas. After the aluminum layer was etched under the above-described conditions, the etching rate loading % on the wafer and the Δ profile at the aluminum layer pattern formed using the etching process were evaluated. The etching rate loading % is a value obtained from the difference between the etching rate of a region having a high pattern density and the etching rate of a region having a low pattern density. The Δ profile is a value obtained from the critical dimension (CD) difference between a top sectional profile and a bottom sectional profile of the aluminum pattern formed using the etching process.

As shown in FIG. 3, as the rate of $N_2$ supplied to the etching chamber increased, micro-loading, e.g., where the etching rate is reduced in a region that has a high pattern density, was improved. On the other hand, when the amount of $N_2$ supplied to the etching chamber was greatly increased, reverse micro-loading, e.g., where the etching rate is increased in a region that has a high pattern density, was observed. Thus, a substantially uniform etching rate may be obtained in regions of the wafer regardless of the difference in the pattern density on the wafer by controlling the amount of $N_2$ in the etching process used to form the aluminum layer.

Figure 4:
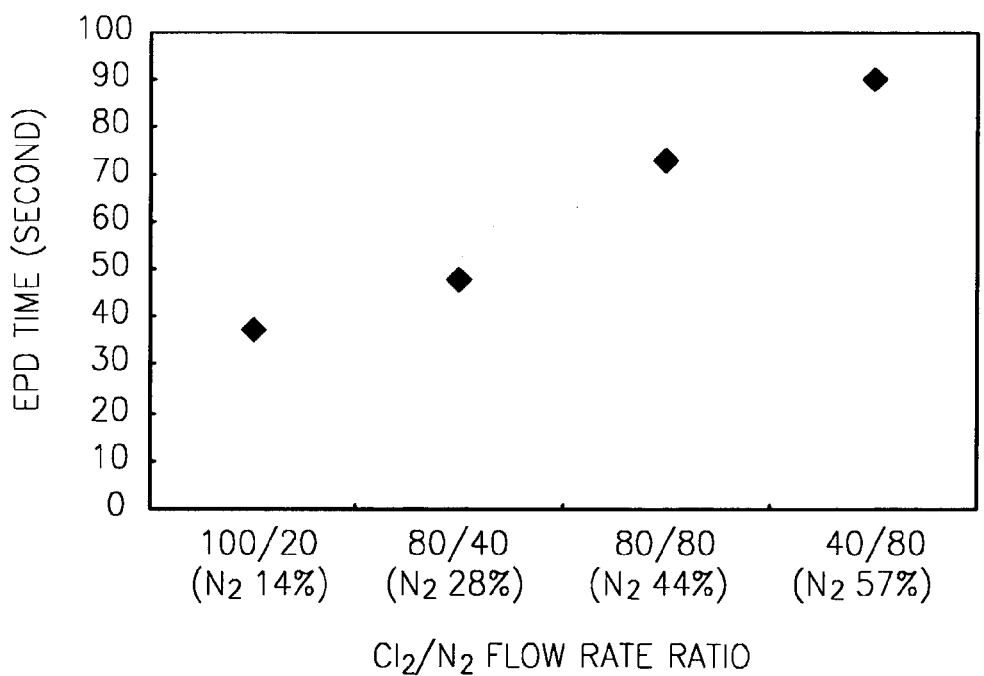
FIG. 4 is a graph illustrating changes in etching rate with respect to the flow rates ratio of $Cl_2$ and $N_2$ when etching an aluminum layer using a metallization method according to an exemplary embodiment of the present invention.

FIG. 4 is a graph illustrating changes in an etching rate with respect to the flow rates of $Cl_2$ and $N_2$ when etching the aluminum layer using an etching gas formed of $Cl_2$ and $N_2$ according to a metallization method for a semiconductor device according to an exemplary embodiment of the present invention.

In order to perform this experiment, the results of which are shown in FIG. 4, an interconnection layer that included an aluminum layer was formed on a semiconductor substrate by sequentially forming a barrier layer, an aluminum layer, and an anti-reflective layer. In this experiment, the barrier layer was formed of a Ti layer having a thickness of 60 Å and a TiN layer having a thickness of 250 Å. The aluminum layer had a thickness of 3500 Å, and the anti-reflective layer was formed of a Ti layer having a thickness of 100 Å and a TiN layer having a thickness of 800 Å. A hard mask layer was formed on the interconnection layer by sequentially depositing a PE-TEOS layer to a thickness of 1500 Å and a SiON layer to a thickness of 400 Å.

$Cl_2$ and the $N_2$ were supplied at flow rates of 100 sccm and 20 sccm, 80 sccm and 40 sccm, 80 sccm and 80 sccm, and 40 sccm and 80 sccm. Ar was supplied at a flow rate of 20 sccm. In this experiment, $N_2$ flowed at rates of 14%, 28%, 44%, and 57%, respectively, of the total flow rate of the etching gas. ICP etching equipment having a dual power source was used, and a source power Ws of 1600 W, a bias power Wb of 220 W, and a pressure of 18 mT were applied. The interconnection layer was etched using the ICP etching equipment according to the above-described conditions, and an end point detection (EPD) time was measured.

Referring to FIG. 4, as the flow rate of $N_2$ increased, the etching rate was lowered. When the flow rate of $N_2$ was 14%, passivation of the interconnection layer pattern was insufficient, which generated an undercut in the profile of the interconnection layer pattern formed by the etching process. This undercutting of the profile was observed in a scanning electron microscope (SEM) photograph. An undercut was also generated when the flow rate of $N_2$ was 28%. However, when the flow rate of $N_2$ was greater than 45%, passivation of the interconnection layer pattern was sufficient and an interconnection pattern having a substantially vertical profile was observed in a SEM photograph. It was also observed that when the flow rate of $N_2$ was more than 65%, the etching rate was lowered, and the $\Delta$ profile of the sidewall of the interconnection pattern was deteriorated to the extent that the profile could not be adjusted in a subsequent process. As a result, the flow rate of $N_2$ may be about 45 to 65% of the total flow rate of the etching gas.

In the method of etching an aluminum layer and metallization method for the semiconductor device according to exemplary embodiments of the present invention, an etching gas that includes $Cl_2$ and $N_2$ (and no $BCl_3$) is used to etch an interconnection layer that includes a metal layer that may be formed of aluminum or an aluminum alloy. $N_2$ may be supplied at a flow rate of about 45 to 65% of the total flow rate of the etching gas to suppress the generation of cone-shaped defects in the interconnection pattern and to reduce the generation of an undercut in the interconnection pattern.

In addition, micro-loading of the wafer and generation of particles, which reduce yield, may be reduced by controlling the flow rate of $N_2$ and, a substantially uniform etching rate may be obtained in regions of the wafer regardless of the difference in pattern density of the different regions. As a result, substantially vertical sidewalls may be obtained with little critical dimension (CD) difference between the top sectional profile and the bottom sectional profile of the interconnection pattern. In exemplary embodiments of the present invention, an interconnection layer including a metal layer that may be formed of aluminum or an aluminum alloy is etched, and a by-product layer having a tight column structure and strong adhesive characteristics may be firmly deposited on the inner walls of the etching chamber so that particles do not fall on and contaminate the wafer.

While this invention has been particularly shown and described with reference to exemplary embodiments thereof, it should be understood by those skilled in the art that various changes in form and details may be made therein without departing from the spirit and scope of the invention as defined by the appended claims.

What is claimed is:

1. A method of etching a metal layer, the method comprising:
   forming a hard mask pattern on a metal layer, the hard mask pattern exposing portions of the metal layer;
   forming a plasma from a gas mixture consisting essentially of a first portion $P_{Cl}$ of chlorine gas, a second portion $P_N$ of nitrogen gas, and a third portion $P_I$ of an inactive gas, wherein the relative volumes of the gases satisfy the expressions $P_{Cl}<P_N$ and $0.45 \leq (P_N/(P_N+P_{Cl}+P_I)) \leq 0.65$; and
   applying the plasma to the exposed portions of the metal layer to remove a portion of the metal layer.

2. The method of claim 1, wherein the metal layer is formed of aluminum or an aluminum alloy.

3. The method of claim 1, wherein the gas mixture is formed by mixing $Cl_2$ and $N_2$ at a volumetric ratio no less than 1:10.

4. The method of claim 1, wherein the hard mask pattern is formed from a material selected from the group consisting of silicon oxides, silicon nitrides and silicon oxynitrides.

5. The method of claim 1, wherein:
   the inactive gas is selected from the group consisting of Ar, He, Ne, Xe and mixtures thereof.

6. A method of etching a metal layer, the method comprising:
   forming a hard mask pattern on a metal layer, the hard mask pattern exposing portions of the metal layer;
   forming a plasma from a gas mixture consisting essentially of a first portion $P_{Cl}$ of chlorine gas, a second portion $P_N$ of nitrogen gas, a third portion $P_I$ of an inactive gas and a fourth portion $P_A$ of an additional active gas, wherein the relative volumes of the gases satisfy the expressions $P_{Cl}<P_N$ and $0.45 \leq (P_N/(P_N+P_{Cl}+P_I+P_A)) \leq 0.65$, and further wherein the additional active aas is selected from the group consisting of HBr, $CF_4$, $CHF_3$, $CF_2F_2$, $SF_5$, $NF_3$, $H_2$, $O_2$, $SiCl_4$, CO, $C_4F_8$, $C_5F_6$, $CCl_4$ and mixtures thereof; and
   applying the plasma to the exposed portions of the metal layer to remove a portion of the metal layer.

7. A metallization method for a semiconductor device, the metallization method comprising:
   forming a hard mask pattern on an interconnection layer including a metal layer;
   forming an interconnection pattern by etching the interconnection layer with a plasma from a gas mixture consisting essentially of a first portion $P_{Cl}$ of chlorine gas, a second portion $P_N$ of nitrogen gas, and a third portion $P_I$ of an inactive gas, wherein the relative volumes of the gases satisfy the expressions $P_{Cl}<P_N$ and $0.45 \leq (P_N/(P_N+P_{Cl}+P_I)) \leq 0.65$; and
   using the hard mask pattern as an etch mask.

8. The method of claim 7, wherein the metal layer is formed of aluminum or an aluminum alloy.

9. The method of claim 7, wherein the gas mixture is formed by mixing $Cl_2$ and $N_2$ at a volumetric ratio no less than 1:10.

10. The method of claim 7, wherein the hard mask pattern is formed from a material selected from the group consisting of silicon oxides, silicon nitrides and silicon oxynitrides.

11. The method of claim 7, wherein:
    the inactive gas is selected from the group consisting of Ar, He, Ne, Xe and mixtures thereof.

12. The method of claim 7, wherein the interconnection layer includes a barrier layer positioned under the bottom of the metal layer.

13. The method of claim 7, wherein the interconnection layer includes an anti-reflective layer formed between the metal layer and the hard mask pattern.

14. A metallization method for a semiconductor device, the metallization method comprising:
    forming a hard mask pattern on an interconnection layer including a metal layer;
    forming an interconnection pattern by etching the interconnection layer with a plasma from a gas mixture consisting essentially of a first portion $P_{Cl}$ of chlorine gas, a second portion $P_N$ of nitrogen gas, a third portion $P_I$ of an inactive gas and a fourth portion $P_A$ of an additional active gas, wherein the relative volumes of the gases satisfy the expressions $P_{Cl}<P_N$ and $0.45 \leq (P_N/(P_N+P_{Cl}+P_I+P_A)) \leq 0.65$, and further wherein the additional active gas is selected from the group consisting of HBr, $CF_4$, $CHF_3$, $CH_2F_2$, $SF_5$, $NF_3$, $H_2$, $O_2$, $SiCl_4$, CO, $C_4F_8$, $C_5F_6$, $CCl_4$ and mixtures thereof; and using the hard mask pattern as an etch mask.

15. A metallization method for a semiconductor device, the metallization method comprising:

forming an interconnection layer including a metal layer on a substrate;

forming a hard mask pattern on the interconnection layer;

etching the interconnection layer with a plasma from a gas mixture consisting essentially of a first portion $P_{Cl}$ of chlorine gas, a second portion $P_N$ of nitrogen gas, and a third portion $P_I$ of an inactive gas, wherein the relative volumes of the gases satisfy the expressions $P_{Cl}<P_N$ and $0.45 \leq (P_N/(P_N+P_{Cl}+P_I)) \leq 0.65$; and using the hard mask pattern as an etch mask.

16. The method of claim 15, wherein the metal is formed of aluminum or an aluminum alloy.

17. The method of claim 15, wherein the gas mixture is formed by mixing $Cl_2$ and $N_2$ at a volumetric ratio no less than 1:10.

18. The method of claim 15, wherein the inactive gas is selected from a group consisting of Ar, He, Ne, Xe and mixtures thereof.

19. The method of claim 15, wherein the hard mask pattern is formed from a material selected from the group consisting of silicon oxides, silicon nitrides and silicon oxynitrides.

20. A metallization method for a semiconductor device, the metallization method comprising:

forming an intel-connection layer including a metal layer on a substrate;

forming a hard mask pattern on the interconnection layer;

etching the interconnection layer with a plasma from a gas mixture consisting essentially of a first portion $P_{Cl}$ of chlorine gas, a second portion $P_N$ of nitrogen gas, a third portion $P_I$ of an inactive gas and a fourth portion $P_A$ of an additional gas, wherein the relative volumes of the gases satisfy the expressions $P_{Cl}<P_N$ $0.45 \leq (P_N/(P_N+P_{Cl}+P_I)) \leq 0.65$ and $(P_A/(P_N+P_{Cl}+P_I+P_A))<0.20$, and further wherein the additional gas is selected from the group consisting of HBr, $CF_4$, $CHF_3$, $CH_2F_2$, $SF_5$, $NF_3$, $H_2$, $O_2$, $SiCl_4$, CO, $C_4F_8$, $C_5F_6$, He—$O_2$, and $CCl_4$; and using the hard mask pattern as an etch mask.

21. A method for reducing the occurrence of microloading using a hard mask pattern as an etch mask and cone-shaped defects in a semiconductor device comprising:

etching an interconnection layer including a metal layer using a hard mask pattern as an etch mask and a plasma from a gas mixture consisting essentially of a first portion $P_{Cl}$ of chlorine gas, a second portion $P_N$ of nitrogen gas, and a third portion $P_I$ of an inactive gas, wherein the relative volumes of the gases satisfy the expressions $P_{Cl}<P_N$ and $0.45 \leq (P_N/(P_N+P_{Cl}+P_I)) \leq 0.65$.

22. The method of claim 21, wherein the metal layer is formed of aluminum or an aluminum alloy.

23. The method of claim 21, wherein the gas mixture is formed by mixing $Cl_2$ and $N_2$ at a volumetric ratio no less than 1:1 to 1:10.

24. The method of claim 21, wherein:

the inactive gas is selected from the group consisting of Ar, He, Ne, Xe and mixtures thereof.

25. A method for reducing the occurrence of microloading using a hard mask pattern as an etch mask and cone-shaped defects in a semiconductor device comprising:

etching an interconnection layer including a metal layer using a hard mask pattern as an etch mask and a plasma from a gas mixture consisting essentially of a first portion $P_{Cl}$ of chlorine gas, a second portion $P_N$ of nitrogen gas, a third portion $P_I$ of an inactive gas and a fourth portion of an additional gas $P_A$, wherein the relative volumes of the gases satisfy the expressions $P_{Cl}<P_N$, $0.45 \leq (P_N/(P_N+P_{Cl}+P_I)) \leq 0.65$ and further wherein the additional gas is selected from the group consisting of HBr, $CF_4$, $CHF_3$, $CH_2F_2$, $SF_5$, $NF_3$, $H_2$, $O_2$, $SiCl_4$, CO, $C_4F_8$, $C_5F_6$, He—$O_2$ and $CCl_4$.

* * * * *